(12) United States Patent
Ishimaru

(10) Patent No.: US 6,690,708 B2
(45) Date of Patent: Feb. 10, 2004

(54) SEMICONDUCTOR LASER DIODE MODULE

(75) Inventor: Tomohisa Ishimaru, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 238 days.

(21) Appl. No.: 09/892,544

(22) Filed: Jun. 28, 2001

(65) Prior Publication Data

US 2002/0012370 A1 Jan. 31, 2002

(30) Foreign Application Priority Data

Jun. 30, 2000 (JP) .......................... 2000-198954

(51) Int. Cl.[7] .................. H01S 3/08; H01S 3/04; H01S 5/00
(52) U.S. Cl. .................. 372/108; 372/36; 372/43
(58) Field of Search .................. 372/43, 34, 36, 372/109, 101, 108; 385/49, 136; 250/239; 359/819, 811

(56) References Cited

U.S. PATENT DOCUMENTS 5,530,785 A * 6/1996 Sakamoto et al. .......... 385/136
5,566,264 A * 10/1996 Kuke et al. .................. 385/49

FOREIGN PATENT DOCUMENTS

JP       05-329673       12/1993

* cited by examiner

Primary Examiner—Quyen Leung
(74) Attorney, Agent, or Firm—Oblon, Spivak, McClelland, Maier & Neustadt, P.C.

(57) ABSTRACT

A semiconductor laser diode module having high fabrication yields and high reliability is provided. A semiconductor laser chip is fixed on a substrate and a first lens and an optical isolator are disposed between the semiconductor laser chip and an optical fiber for receiving light emitted from the semiconductor laser chip. A lens holder fixed with the first lens and a housing fixed with the optical isolator are laser-welded and fixed to clamping parts of a lens holder retainer and an optical isolator retainer, respectively. Laser welding portions of the clamping parts of the lens holder retainer and the optical isolator retainer are formed to have a thickness thinner than that on the substrate side of the clamping parts and have almost the same thickness in the height direction. Curved surfaces, for example, which tilt in the direction thickening toward the lower side, are formed on the lower side thereof.

10 Claims, 5 Drawing Sheets

Prior Art

SEMICONDUCTOR LASER DIODE MODULE

BACKGROUND OF THE INVENTION

Recently, as a pumping source for a signal light source or optical fiber amplifier for optical communications, semiconductor laser chips have been used increasingly. When the semiconductor laser chip is used as such a light source, in many cases, it is used as a semiconductor laser diode module, a device in which a laser light emitted from the semiconductor laser chip is optically coupled to an optical fiber. Between the semiconductor laser chip and the optical fiber, a lens or optical isolator is disposed. The laser welding technique is generally applied for fixing these optical components.

SUMMARY OF THE INVENTION

The present invention provides a semiconductor laser diode module that can be used as a light source. In accordance with one aspect of the invention, a semiconductor laser diode module comprises:

a base;

a semiconductor laser chip mounted on the base;

an optical fiber for receiving light emitted from the semiconductor laser chip;

one or a plurality of optical components disposed between the semiconductor laser chip and the optical fiber; and an optical component retaining member for retaining and fixing the optical component on the base, wherein the bottom side of the optical component retaining member is fixed to the base and the upper side of the optical component retaining member is provided with a clamping part for clamping the optical component from outside surfaces thereof, the clamping part is formed with a thin part on the top end side thereof, the thin part having a thickness thinner than that of the base side and having a thickness almost equal, where the optical component is laser-welded and fixed to the clamping part at a position of the top end side of the thin part having the thickness almost equal.

BRIEF DESCRIPTION OF THE DRAWINGS

Exemplary embodiments of the invention will now be described in conjunction with drawings in which.

DETAILED DESCRIPTION

Figure 4A:
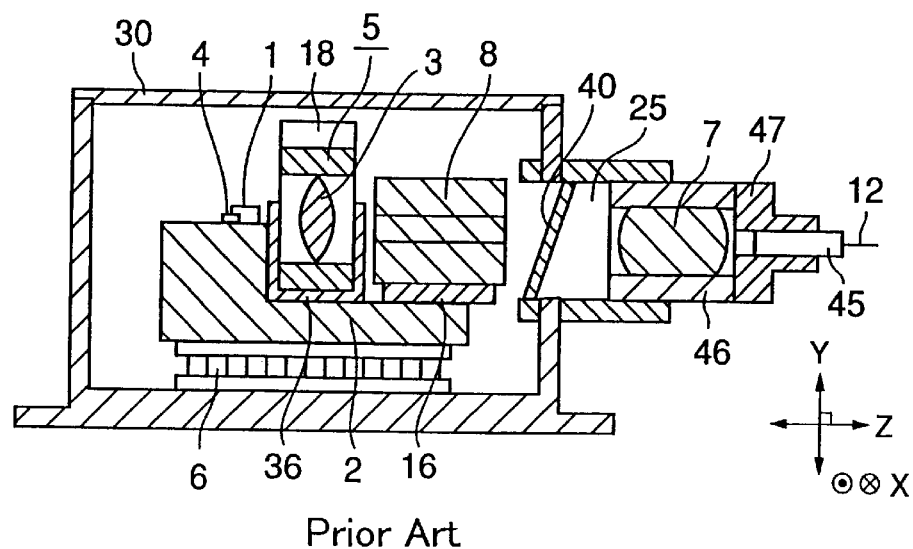
FIG. 4 shows a cross-sectional view of a conventional semiconductor laser diode module.
FIG. 4B shows an oblique perspective view of the configuration inside a housing of the conventional semiconductor laser diode module.

FIG. 4A shows one example of a conventional semiconductor laser diode module by way of a cross-sectional view. As shown in the same drawing, a package 30 has a through hole 25 formed on one end side thereof. A substrate (base) 2 is disposed inside the package 30. A semiconductor laser chip 1 is fixed to a fixing part of the substrate 2. A thermister 4 is disposed near the semiconductor laser chip 1. A Peltier module 6 is disposed on the under side of the substrate 2. The Peltier module 6 has a function of maintaining temperatures of the semiconductor laser chip 1 constant, based on the temperatures detected by the thermister 4.

On the outgoing side of the semiconductor laser chip 1, a first lens 3 for transmitting therethrough the emitted light of the semiconductor laser chip 1 is disposed. This first lens 3 consists of a collimator lens, which collimates the light emitted from the semiconductor laser chip 1. On the outgoing side of the first lens 3, a polarized wave dependent optical isolator 8 is disposed.

Additionally, a light transparent plate 40 for sealing the package is fixed to the through hole 25 in the package 30. The light transparent plate 40 is formed of sapphire glass or the like. A lens holder 46 is inserted into and fixed to the through hole 25. On one end side (the right side of the drawing) of the lens holder 46, a ferule holder 47 is fixed. To the ferule holder 47, a ferrule 45 is fixed. To the ferrule 45, an optical fiber (single mode optical fiber) 12 is inserted and fixed.

The light receiving end surface side (in FIG. 4A, the lens holder 46 side) of the optical fiber 12 is disposed so as to facing to the outgoing side of the semiconductor laser chip 1. To the lens holder 46, a second lens 7 for condensing the transmitted light of the optical isolator 8 on the incident side of the optical fiber 12 is fixed.

Figure 4B:
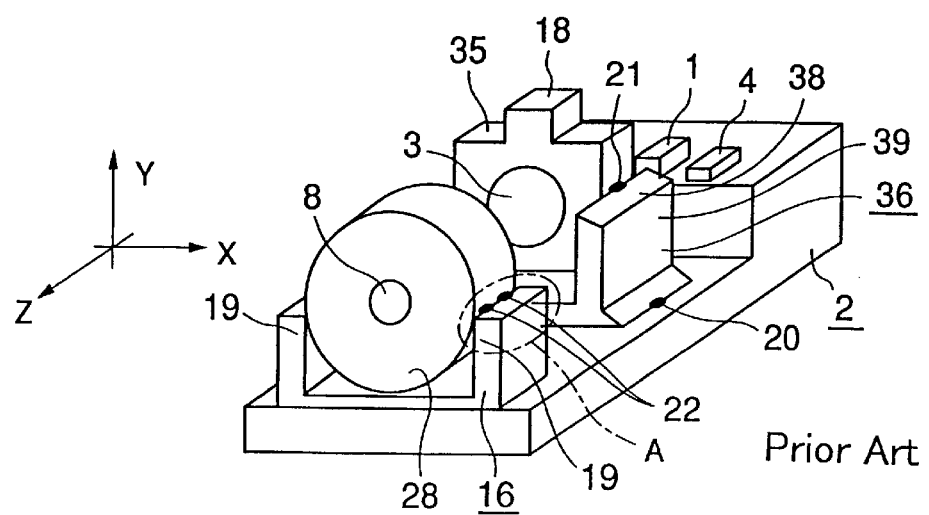

As shown in FIGS. 4A and 4B, the first lens 3 is fixed to a lens holder 35 made of metal such as stainless. The lens holder 35 has a projecting part 18. An optical component (optical functional component) consisting of the first lens 3 and the lens holder 35 is fixed to the substrate 2 through a lens holder retainer 36 as an optical component retaining part.

On the lens holder retainer 36, a pair of clamping parts 39 is disposed for clamping the lens holder 35 from both side surfaces (in FIG. 4B, because one side of the clamping parts is not seen hiding behind the lens older 35 and a housing 28, only one side of the clamping parts 39 is shown). The lens holder 35 is laser-welded and fixed to these clamping parts 39. This laser welding fixing is conducted by YAG welding (laser welding by a YAG laser) at a YAG welding spot 21. Furthermore, the bottom of the lens holder re-tainer 36 is YAG-welded at a YAG welding spot 20 to be fixed to the substrate 2.

Moreover, the optical isolator 8 is fixed to the cylindrical metal housing 28. An optical component (optical functional component) made of the housing 28 and the optical isolator 8 is fixed to the substrate 2 through an optical isolator retainer 16 as the optical component retaining part. The optical isolator retainer 16 is arranged on the substrate 2 and has a pair of clamping parts 19 for clamping the housing 28 from both side surfaces thereof. The housing 28 is laser-welded and fixed to the clamping parts 19 of the optical isolator retainer 16 at YAG welding spots 22 by YAG welding.

In the semiconductor laser diode module as described above, the laser light emitted from the semiconductor laser chip 1 is collimated by the first lens 3. The resultant parallel light passes through the optical isolator 8. Then, it is entered to the end surface (connected end surface) of the incident side of the optical fiber 12 by the second lens 7 and is guided through the optical fiber 12 and used for desired purpose.

In addition, when the semiconductor laser chip 1 is driven, heat is generated to raise the temperature of the semiconductor laser chip 1. This temperature rise causes the change of the oscillation wavelength and light output of the semiconductor laser chip 1. On this account, the current supplied to the Peltier module 6 is adjusted based on the temperatures detected by the thermister 4. This current adjustment allows the temperatures of semiconductor laser chip 1 to be kept constant, which prevents the change in the oscillation wavelength and light output of the semiconductor laser chip 1 from being generated.

The semiconductor laser diode module as described above is fabricated by the following method. That is, a carrier to which the semiconductor laser chip 1 is fixed is solder-fixed on the substrate 2 and then the first lens 3 is positioned and fixed by using an infrared camera so as to collimate the light emitted from the semiconductor laser chip 1.

Furthermore, the first lens 3, for example, has been fixed to the lens holder 35 beforehand by low-melting glass, and then the lens holder 35 is fitted into the lens holder retainer 36. With this state, the first lens 3 is positioned while passing the light emitted from the semiconductor laser chip 1 through the first lens 3. This positioning is conducted by observing the light emitted from the first lens 3 with the infrared camera, and moving the lens holder 35 in the Y and X directions with respect to the lens holder retainer 36 and/or in the X and Z directions so as to form this light into parallel light.

Then, the positioned point of the lens holder 35 is YAG-welded and fixed to the lens holder retainer 36 at the YAG welding spot 21, and the lens holder retainer 36 is YAG-welded and fixed to the substrate 2 at the YAG welding spot 20.

Subsequently, the optical isolator 8 is aligned and fixed as follows. That is, the light emitted from the first lens 3 is launched into the optical isolator 8 while driving the semiconductor laser chip 1. Then, the optical isolator 8 is rotated together with the housing 28. This rotation is conducted around the optical axis of the optical isolator 8. Then, during rotating, the light emitted from the ongoing side of the optical isolator 8 is received by a light receiver such as a power meter, and the housing 28 is YAG-welded and fixed to the optical isolator retainer 16 at the position where the received intensity becomes maximum.

Next, as described above, the semiconductor laser chip 1, the first lens 3 and the optical isolator 8 are fixed on the substrate 2 in the aligned state and then the substrate 2 is fixed on the Peltier module 6 inside the housing 30 for electrical connection using a gold wire. Additionally, the lens holder 46 having the second lens 7 fixed thereto and the ferrule holder 47 having the ferrule 45 fixed thereto are inserted into and fixed to the through hole 25. Thereby, the semiconductor laser chip 1 is optically connected to the optical fiber 12 through the first lens 3, the optical isolator 8 and the second lens 7.

Figure 5A:
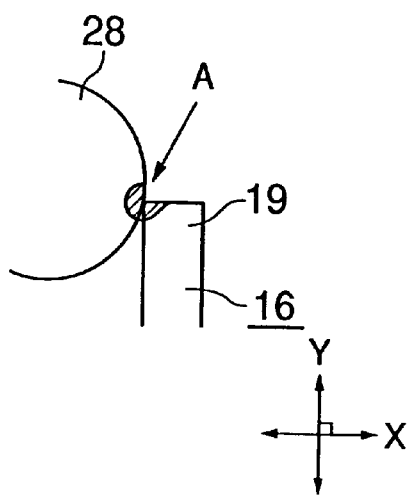
FIGS. 5A to 5E show diagrams for views illustrating problems of the comventional semiconductor laser diode module.
Figure 5B:
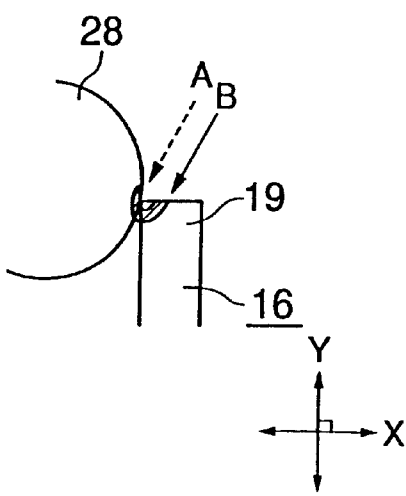

However, in the conventional semiconductor laser diode module as set forth, the clamping part 19 of the optical isolator retainer 16 extends from the tip end side to the substrate 2 side with a uniform thickness which is relatively large. There may be a case where laser irradiation during YAG welding is performed onto the accurate position as indicated by an arrow A in FIG. 5A, but it often shifts in the X direction as indicated by an arrow B in FIG. 5B. In conventional examples, the clamping part 19 has a thickness (width) too much and thus the shift of the irradiated position caused to vary the molten amount of the housing 28 and the clamping part 19 by YAG welding.

Figure 5C:
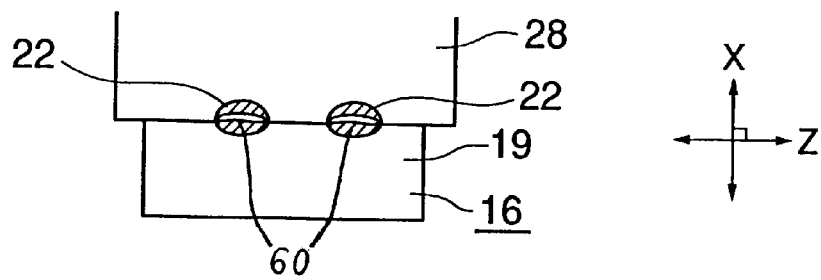

When the molten amount is small, for example, as shown in FIG. 5C, a problem arises that cracks 60 are generated at the YAG welding spots 22. Furthermore, laser welding fixing is conducted in contemplation of the molten amount of materials at the welding portion. Therefore, a problem arises that the variation in the molten amount causes to shift the fixed position of the housing 28.

As a result, obstructions are generated in the optical coupling of the semiconductor laser chip 1 to the optical fiber 12, which is conducted through the optical isolator 8, and thus fabrication yields are dropped, or the mechanical strength of the semiconductor laser diode module is decreased. Consequently, the reliability of the semiconductor laser diode module is impaired.

Figure 5D:
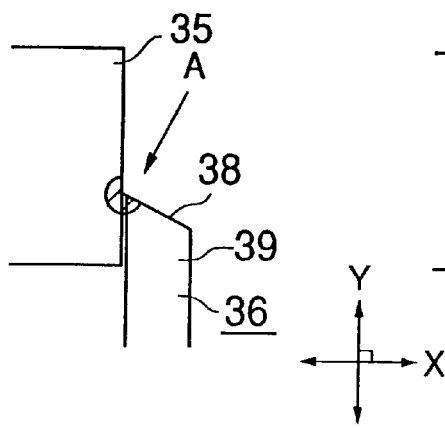
Figure 5E:
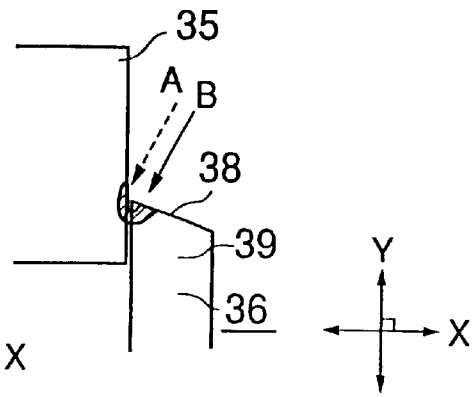

As shown in FIG. 4B, the clamping part 39 of the lens holder retainer 36 is formed with a slope 38 which tilts straight. Thus, the variation in the thickness of the section along the slope on the tip end side of the clamping part 39 is large. Thus, as apparent from the comparison of FIG. 5D with FIG. 5E, a problem arises due to the shift of the laser light irradiated position in the laser welding fixing of the lens holder 35 to the lens holder retainer 36, similar to the case of the welding fixing of the optical isolator 8 as set forth.

In one aspect, the invention provides a semiconductor laser diode module capable of accurately conducting laser welding fixing of the optical components, which therefore has high yields and high reliability.

Figure 1A:
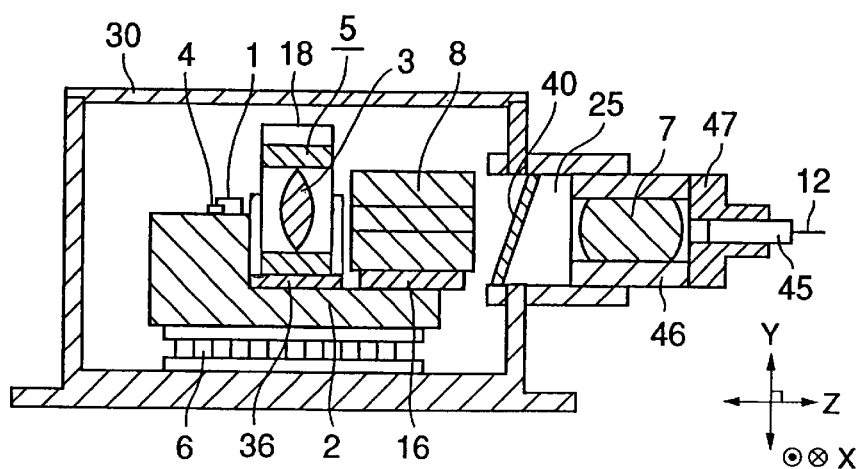
FIG. 1A shows a cross-sectional view illustrating the configuration of one embodiment of the semiconductor laser diode module of the invention.

Hereafter, one embodiment of the invention will be described in reference to the drawings. Additionally, in the following description of the embodiment, portions having the same designation as the portions described in the conventional example are designated by the same reference numerals and signs, omitting or simplifying the overlapping explanation. FIG. 1A shows one embodiment of the semiconductor laser diode module in the invention by way of a cross-sectional view.

Figure 1B:
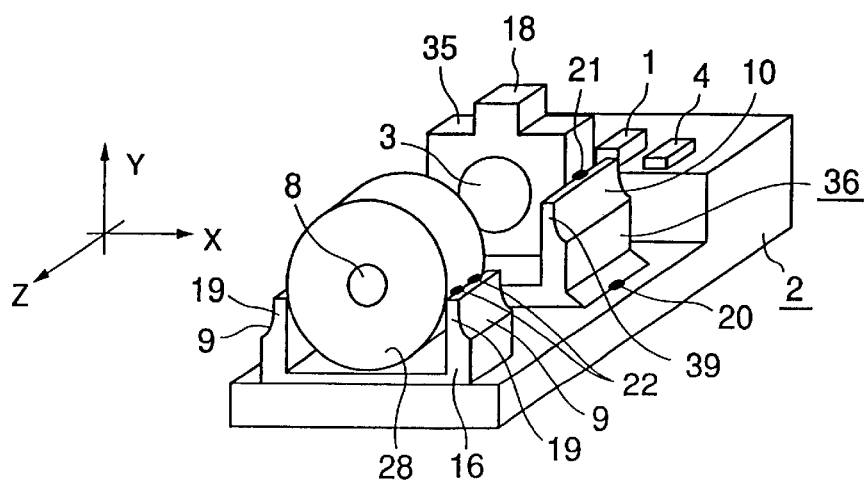
FIG. 1B shows an oblique perspective view illustrating the configuration inside a housing of the module of the same embodiment.

This embodiment has almost the same configuration as the semiconductor laser diode module shown in FIGS. 4A and 4B. The point where this embodiment differs from the conventional example is in that an optical isolator retainer 16 and a lens holder retainer 36 have a distinctive configuration as shown in FIG. 1B.

That is, each of the optical isolator retainer 16 and the lens holder retainer 36 is formed in which at least the laser welding portions (the top end side of clamping parts 19 and 39) of the clamping parts 19 and 39 have a thickness thinner than that of the substrate 2 side of the clamping parts 19 and 39, and the portions have a part with the thickness almost equal. In the example shown in FIG. 1B, each of the optical isolator retainer 16 and the lens holder retainer 36 secures the portion of the thickness almost equal with a predetermined length from the laser welding portion at the top end part of the clamping parts 19 and 39 toward a lower place. Then, on the outer surface side lower than the section having the thickness almost equal, a thickness varying part is formed where the thickness is thickened toward the under side. In the example shown in FIG. 1B, these thickness varying parts have curved surfaces (round surfaces) 9 and 10 which curve and tilt in the thickness direction toward a lower place.

Figure 2A:
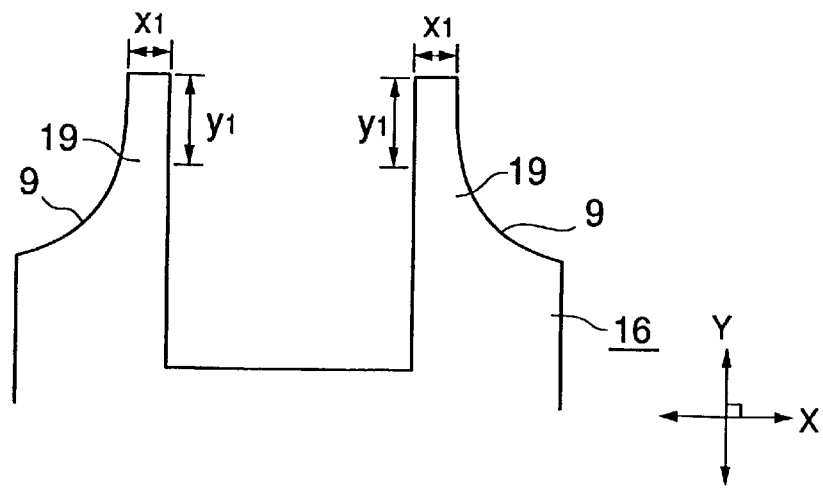
FIGS. 2A and 2D show explanatory drawings illustrating various exemplary arrangements of optical isolator retainers applied to one embodiment.

FIG. 2A shows one exemplary arrangement of the clamping parts 19 of the optical isolator retainer 16 by way of a front elevation. Here, the width direction of the optical isolator retainer 16 is set the X direction and the height direction is set the Y direction. As shown in FIG. 2A, in the top end side (tip end side) of the clamping parts 19 of the optical isolator retainer 16, a thickness (a thickness in the X direction) along a length $y_1$ in the Y direction from the top end thereof toward the lower place is set to have almost the same thickness, $x_1$. The length of the $y_1$ is 0.1 to 0.2 mm, for example, and the thickness of the $x_1$ is 0.1 mm or under, for example. Additionally, the curved surface (curved tapered surface) 9 is formed to have a curved surface that projects underside.

Alternatively, the distance position $y_1$ where the curved surface 9 starts from the top end may be set $y_1=0$. That is, as shown in FIG. 2D, the curved surface 9 may be formed just from the top end of the clamping parts 19 on the outer surface side including the laser welding portion. In this example, the curved surface 9 is formed in a circular arc shape having a radius of R=1.5 mm. However, a center O of the circular arc has almost the same height as the top end portion of the clamping parts 19. Thereby, the laser welding part is formed thinner and the section having almost the same thickness is formed from the top end toward a lower place. Furthermore, the circular arc radius R of the curved surface 9 is set one-third to two-thirds of a diameter (outer diameter) of the housing 28, preferably about a half. In this embodiment, R=1.5 mm as set forth because the diameter of the housing 28 is 3 mm.

Moreover, in this embodiment, the configuration of the clamping parts 39 of the lens holder retainer 36 is the same as that of the clamping parts 19 of the optical isolator retainer 16.

In this embodiment, the clamping parts 19 and 39 of the optical isolator retainer 16 and the lens holder retainer 36 formed with the thinner laser welding portions that have almost the same thickness. Thus, their thermal capacity is small as compared with the laser welding portions of the clamping parts 19 and 39 of the optical isolator retainer 16 and the lens holder retainer 36 in the conventional semiconductor laser diode module.

Figure 2B:
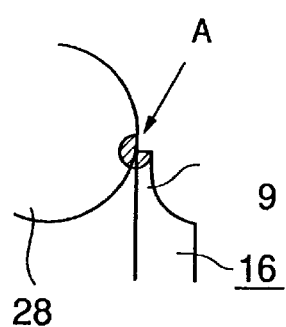
FIGS. 2B and 2C show explanatory drawings illustrating examples of states of laser welding between the optical isolator retainer and the housing.
Figure 2C:
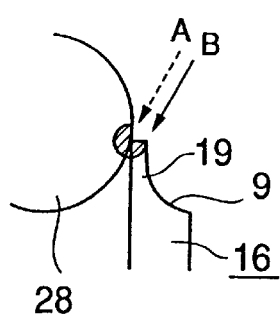
Figure 2D:
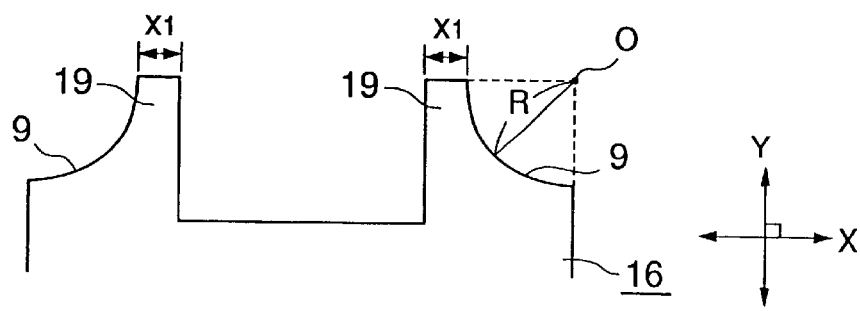

On this account, without mentioning the case in which laser is irradiated onto the accurate position as indicated by an arrow A in FIG. 2B and laser welding is done, as shown in FIG. 2C, even when the laser irradiated position is slightly shifted from the arrow A to an arrow B, the molten amount of the clamping part by laser welding is little varied. Then, this molten amount becomes larger and the variation in the molten amount is small, as compared with the case in which the laser light is irradiated onto the thicker clamping parts 19 and 39 of the conventional example (see FIGS. 4A and 4B).

Accordingly, in this embodiment, the molten amount of the clamping parts becomes a proper amount that satisfies a required amount sufficiently when laser welding fixing and therefore the fixing strength is not decreased. In addition, the problem can be suppressed that the variation in the molten amount causes shifting the fixed position of the housing 28 or the lens holder 35. Thus, the semiconductor laser diode module having high fabrication yields and high reliability can be achieved.

Furthermore, in this embodiment, the curved surfaces 9 and 10 that project underside are disposed on the lower side than the clamping parts 19 and 39 of the optical isolator retainer 16 and the lens holder retainer 36. Therefore, the laser welding portions are easily tracked and laser welding can be controlled easily. Thus, the semiconductor laser diode module can be fabricated with further ease and fabrication yields can be improved.

Then, the optical isolator retainer 16 and the lens holder retainer 36 have the lower side thickened toward a lower place, where the side is lower than the portion of the section with almost the same thickness of the laser welding portions of the clamping parts 19 and 39; the thickness on the substrate 2 side (bottom side) thereof becomes greater substantially. Accordingly, the clamping parts 19 and 39 of the optical isolator retainer 16 and the lens holder retainer 36 can strongly and stably fix the housing 28 of the optical isolator 8 and the lens holder 35 of the first lens 3, respectively.

Figure 3A:
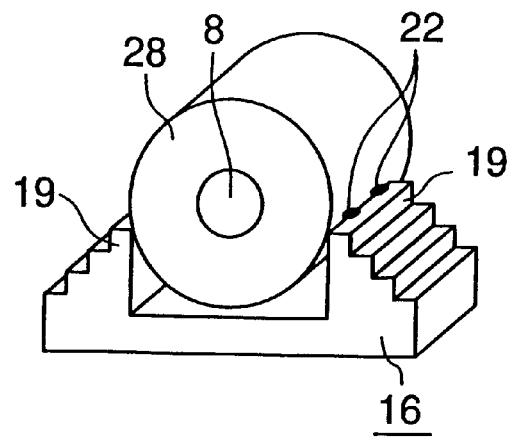
FIGS. 3A to 3C show explanatory drawings illustrating various exemplary arrangements of optical isolator retainers applied to one embodiment of the semiconductor laser diode module of the invention.
Figure 3B:
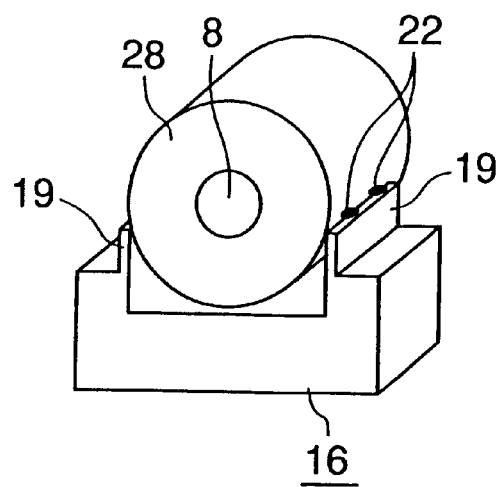

Additionally, the invention is not limited to the embodiment as set forth, which can adopt various embodiments. For example, in the embodiment described above, the clamping parts 39 and 19 of the lens holder retainer 36 and the optical isolator retainer 16 were formed with the thickness varying parts by disposing the curved surfaces 10 and 9 on the lower side of the laser welding portions, respectively. However, for example, as shown in FIGS. 3A and 3B (in these drawings, the configuration of an optical isolator 16 is illustrated as a typical example), stepped clamping parts 19 and 39 having no curved surface may be formed. In this stepped example, thin parts of the clamping parts 19 and 39 having YAG welding spots 21 and 22 are formed to have a constant thickness only in the sectional length (a step height) in a height direction (the vertical direction).

Furthermore, the thickness varying parts may be formed in a tapered plane where the lower side becomes thickened, instead of the curved surfaces 10 and 9.

Figure 3C:
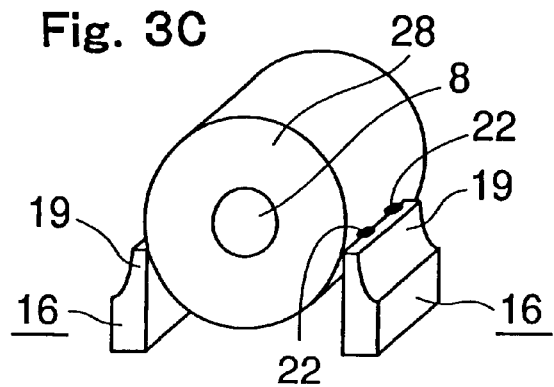

Moreover, in the embodiment as set forth, the lens holder retainer 36 and the optical isolator retainer 16 were formed in an integral-type member configuration, both having the pair of clamping parts 39 and 19, respectively. For example, as shown in FIG. 3C, single-piece optical isolator retainers 16 having one clamping part 19 may be used as arranged face to face. Similarly, single-piece lens holder retainers 36 having one clamping part 39 may be used as arranged face to face.

Besides, in the embodiment as set forth, the first lens 3 was fixed to the lens holder 35 and the optical isolator 8 was fixed to the housing 28 separated from the lens holder 35. However, it may be configured that the first lens 3 and the optical isolator 8 are set in an adjusted state to be fixed in a common holder and this holder is fixed to a holder retaining part as the optical component retaining part. In this case, the holder retaining part is also configured to have the clamping parts as the above-mentioned embodiment. The holder is laser-welded and fixed to the holder retaining part and thereby the same effect as the above-said embodiment can be exerted.

Additionally, it may be configured that the first lens 3, the optical isolator 8 and the second lens 7 are set in an adjusted state to be fixed to a common holder and this holder is fixed to a holder retaining part as the optical component retaining part. In this case, the holder retaining part is also configured to have the clamping parts as the above-mentioned embodiment and the holder is laser-welded and fixed to the holder retaining part. Thereby, the same effect as the above-said embodiment can be exerted.

Furthermore, the semiconductor laser diode module of the invention is not necessarily configured by disposing the first lens 3, the optical isolator 8 and the second lens 7 between the semiconductor laser chip 1 and the optical fiber 12.

Varieties, configurations and numbers of the optical components disposed between the semiconductor laser chip 1 and the optical fiber 12 are set arbitrarily.

As described above, the invention can be applied to various semiconductor laser diode modules that are configured in which optical components are disposed between a semiconductor laser chip and an optical fiber for receiving light from the semiconductor laser chip, the optical components are held by an optical component retaining part provided with clamping parts for clamping the optical components from outside surfaces and the optical components are laser-welded and fixed to the clamping parts.

Moreover, in the invention, laser welding fixing of the optical components with the clamping parts is not necessarily conducted by YAG welding. Laser welding other than YAG welding may be adopted. However, YAG welding is excellently suitable to laser welding fixing of the optical components in the semiconductor laser diode module and thus laser welding fixing is preferably conducted by YAG welding.

What is claimed is:

1. A semiconductor laser diode module comprising:

a base;

a semiconductor laser chip mounted on said base;

an optical fiber adapted to receive light emitted from the semiconductor laser chip;

an optical component disposed between said semiconductor laser chip and said optical fiber; and an optical component retaining member retaining and fixing said optical component on the base, the optical component retaining member comprising a clamping part clamping an outside surface of the optical component and a bottom portion fixed to the base, the clamping part including a top end portion connected with the outside surface of the optical component, the top end portion having a top end surface substantially perpendicular to the outside surface of the optical component, the top end portion having a thickness less than a thickness of the bottom portion.

2. The semiconductor laser diode module according to claim 1, wherein said top end portion of said clamping part comprises a portion of an uniform thickness existing over a predetermined length from said top end surface.

3. The semiconductor laser diode module according to claim 1, wherein said top end portion and said bottom portion are connected with a thickness varying part of stepwise thickness increasing towards said bottom portion.

4. The semiconductor laser diode module according to claim 1, wherein said top end portion and said bottom portion are connected with a thickness varying part comprising a concave surface with increasing thickness towards said bottom portion.

5. The semiconductor laser diode module according to claim 1, wherein said top end portion and said bottom portion are connected with a thickness varying part comprising a tapered plane with increasing thickness towards said bottom portion.

6. The semiconductor laser diode module according to claim 1, wherein the optical component comprises an optical member having a lens adapted to transmit a light emitted from the semiconductor laser chip toward the optical fiber.

7. The semiconductor laser diode module according to claim 1, further comprising:

a second optical component having an optical isolator adapted to transmit a light emitted from the lens to the optical fiber.

8. The semiconductor laser diode module according to claim 1, wherein a laser-weld connects the top end portion of the clamping part with the optical component.

9. The semiconductor laser diode module according to claim 8, wherein portions of the top end portion of the clamping part have the same thickness.

10. A semiconductor laser diode module comprising:

a base;

a semiconductor laser chip mounted on the base;

an optical fiber adapted to receive light emitted from the semiconductor laser chip;

an optical component disposed between the semiconductor laser chip and the optical fiber; and an optical component retaining member comprising a clamping part including a top end portion connected with an outside surface of the optical component and a bottom end portion connected with the base, the top end portion having a top surface that is about perpendicular to the outside of the optical component and that has a thickness less than a thickness of the bottom end portion.

* * * * *